(12) United States Patent
Vashchenko et al.

(10) Patent No.: US 7,795,102 B1
(45) Date of Patent: Sep. 14, 2010

(54) ESD HIGH FREQUENCY DIODES

(75) Inventors: Vladislav Vashchenko, Palo Alto, CA (US); Vladimir Kuznetsov, Santa Clara, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 113 days.

(21) Appl. No.: 11/654,735

(22) Filed: Jan. 17, 2007

(51) Int. Cl.
*H01L 21/331* (2006.01)
(52) U.S. Cl. .................. 438/309; 438/328; 438/170; 438/189; 257/361; 257/E21.352
(58) Field of Classification Search .............. 257/361, 257/362, 197, E29.184, E29.174, 363, 297; 438/309, 170, 328, 380, 167, 189
See application file for complete search history.

(56) References Cited

U.S. PATENT DOCUMENTS

| | | | | |
|---|---|---|---|---|
| 5,025,302 | A * | 6/1991 | Soclof | 257/622 |
| 7,119,401 | B2 * | 10/2006 | Voldman | 257/362 |
| 7,443,008 | B2 * | 10/2008 | Lutz et al. | 257/529 |
| 7,449,389 | B2 * | 11/2008 | Meister et al. | 438/379 |
| 2006/0223258 | A1 * | 10/2006 | Okushima | 438/202 |

* cited by examiner

*Primary Examiner*—Ha Tran T Nguyen
*Assistant Examiner*—Shaun Campbell
(74) *Attorney, Agent, or Firm*—Jurgen K. Vollrath; Vollrath & Associates

(57) ABSTRACT

In a SiGe BJT process, a diode is formed by defining a p-n junction between the BJT collector and BJT internal base, blocking the external gate regions of the BJT and doping the emitter poly of the BJT with the same dopant type as the internal base thereby using the emitter contact to define the contact to the internal base. Electrical contact to the collector is established through a sub-collector or by means of a second emitter poly and internal base both doped with the same dopant type as the collector.

10 Claims, 2 Drawing Sheets

ESD HIGH FREQUENCY DIODES

FIELD OF THE INVENTION

The invention relates to ESD protection in high frequency applications. In particular it relates to I/O protection using ESD protection diodes.

BACKGROUND OF THE INVENTION

When it comes to the ESD protection of high speed pads, e.g. I/O pads for radio frequency (RF) circuits such as operational amplifiers and ESD protection device with low parasitic capacitance is required.

Current solutions for providing ESD protection diodes is to provide standard diffusion CMOS diodes involving a p-n junction between an n+ region and a p-well or between a p+ region and an n-well. However, these devices cannot be implemented in a pure bipolar process. Also, they involve a large junction area with correspondingly high parasitic capacitance.

A simplified circuit diagram of a prior art ESD protection network for differential amplifiers is shown in FIG. 1 and includes the differential amplifiers 100, 102 with their outputs 104, 106, respectively. ESD protection diode 110 is connected between the VDD power supply rail and input pad 112, while diode 114 is connected between the input pad 112 and ground. Similarly, diode 120 is connected between the VDD power supply rail and input pad 122, while diode 124 is connected between the input pad 122 and ground. The outputs 104, 106 are similarly protected by diodes 130, 132 and 140, 142, respectively, as shown. The circuit also includes a BSCR clamp 150 connected between the VDD power supply rail and ground for protecting against electrostatic discharges (ESD) across the power supply rails.

The current application proposes the creation of an ESD protection diode making use of a poly-emitter BJT that addresses some of the problems with prior art diffusion diodes.

SUMMARY OF THE INVENTION

According to the invention a method of forming an ESD protection diode comprises adopting a bipolar process for forming a bipolar junction transistor (BJT) that includes an emitter, a base, and a collector, forming the p-n junction of the diode between the collector and an internal base of the BJT, blocking the formation of an external base, and doping the emitter with the same dopant type as the base to establish a base contact. The BJT may comprise a self-aligned architecture, e.g. a fully self-aligned or quasi-self-aligned architecture. The process may be a SiGe process and the bipolar transistor may be based on an NPN or PNP transistor, wherein in each case the emitter is doped with the same dopant type as the base. Contact to the collector may include forming a sub-collector comprising a sinker and a buried layer, e.g. a p-sinker and p-buried layer (PBL) in the case of a p-collector. Instead an internal base and emitter may be formed of the same dopant type as the collector to provide a contact to the collector.

DETAILED DESCRIPTION OF THE INVENTION

The present invention proposes making use of a bipolar process to form a small junction area ESD protection diode. In particular, one embodiment of the invention proposes using a SiGe process making use of some of the steps involved in forming an npn or pnp bipolar junction transistor.

Figure 1:
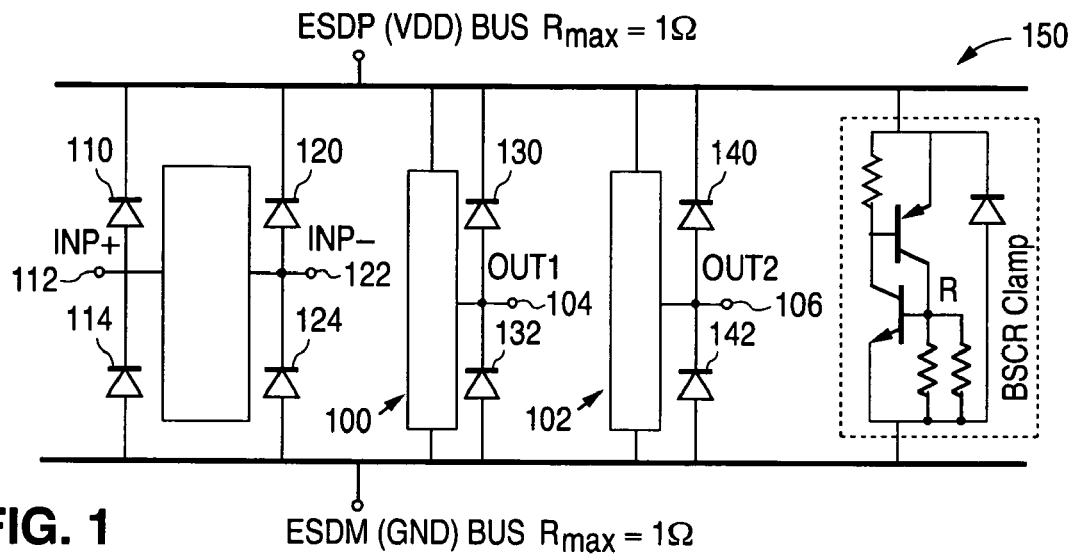
FIG. 1 is a simplified schematic circuit diagram of an ESD protection network for differential amplifiers of the prior art.
Figure 2:
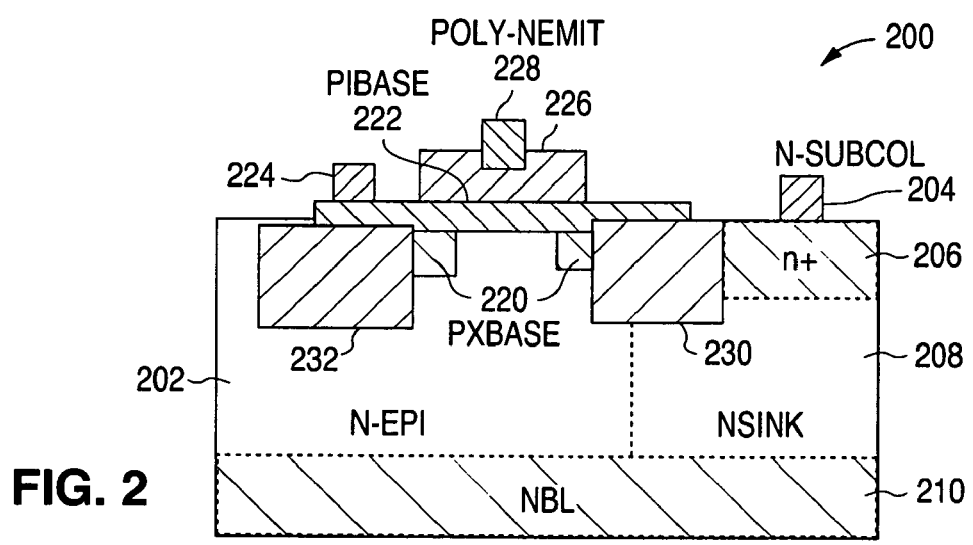
FIG. 2 shows a cross section through a prior art SiGe NPN bipolar transistor.

FIG. 2 shows a simplified prior art NPN BJT implemented using a SiGe process. The NPN BJT 200 includes an n-collector 202 defined by an n-epitaxial region. The collector contact 204 contacts an n+ region 206 and provides the contact for the collector 202 by virtue of a sub-collector involving an n-sinker 208 and an n-buried layer 210. The BJT 200 further includes a base involving p-external base regions 220 and p-internal base 222 with base contact 224, and an n-emitter poly 226 with emitter contact 228. FIG. 2 also shows shallow trench isolation regions 230, 232.

The present invention adopts the process involved in forming the BJT of FIG. 2 and adjusts the process to form a diode. In particular, the present invention forms a p-n junction between the collector and internal base of the BJT. In order to avoid the external base from introducing additional parasitic capacitance, the external base regions are blocked during the process. Furthermore, since the internal base typically has a high sheet resistance, contact to the base is achieved by doping the emitter poly with opposite dopant type than would be the case for the typical BJT process. Thus the emitter poly is instead doped with the same dopant type as the base, and the emitter contact is used to define the contact for the internal base. Contact to the collector is in turn achieved in different ways as will become clearer from the discussion with reference to FIGS. 3-6. Also, while the discussion above referred to the process for an NPN BJT, the invention applies equally to the process for a PNP BJT, as will also become clearer below.

Figure 3:
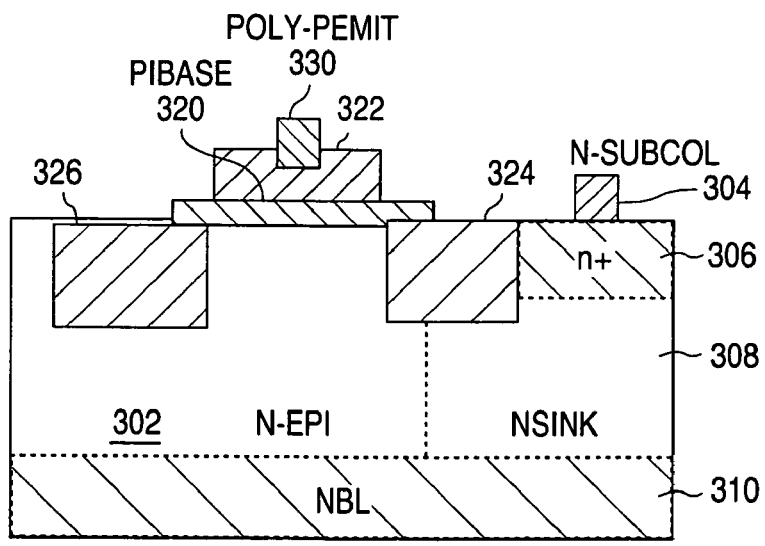
FIG. 3 shows a cross section through one embodiment of a SiGe architecture diode of the invention.

FIG. 3 shows a diode implemented using an SiGe NPN BJT architecture as the basis. The n-collector defined by n-epi 302 is retained together with the collector contact 304 that contacts the n-collector through n+ region 306, sinker 308, and n-buried layer (NBL) 310. The internal base 320 and emitter poly 322 are also formed, as are the shallow trench isolation regions 324, 326. However, the external base regions found in the standard SiGe BJT is blocked to avoid the parasitic effect from the external bases. Also, instead of providing a direct contact to the internal base 320, the emitter poly 322 is doped with the same dopant type as the internal base 320 (p-type), and the emitter contact 330 is used as the contact to the internal base 320 via the emitter poly 322. Thus the contact 330 defines the anode of the diode, while the collector contact 304 forms the cathode.

Figure 4:
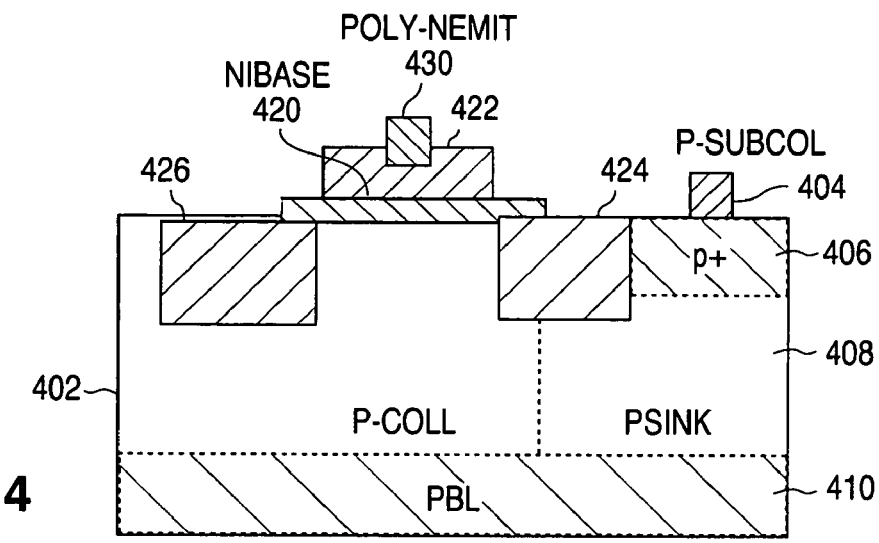
FIG. 4 shows a cross section through another embodiment of a SiGe architecture diode of the invention.

As mentioned above, the diode can instead be implemented using a SiGe PNP BJT process. Such a diode is shown in FIG. 4. In this embodiment the p-collector defined by p-epi 402 is retained together with the collector contact 404 that contacts the p-collector through p+ region 406, p-sinker 408, and p-buried layer (PBL) 410. The internal base 420 and emitter poly 422 are also formed, as are the shallow trench isolation regions 424, 426. However, the external base regions found in the standard SiGe BJT are once again blocked to avoid the parasitic effect from the external bases. Also, instead of providing a direct contact to the internal base 420, the emitter poly 422 is doped with the same dopant type as the internal base 420 (n-type), and the emitter contact 430 is used as the contact to the internal base 420 via the emitter poly 422. Thus the contact 430 defines the cathode of the diode, while the collector contact 404 forms the anode.

Instead of making use of a sub-collector to provide the collector contact, another embodiment makes use of a second internal base and poly-emitter to define a collector contact. The second internal base and poly-emitter are both provided with opposite dopant type to the first internal base and poly-emitter, thus being of the same dopant type as the collector and defining a collector contact. Two such embodiments are shown in FIGS. 5 and 6.

Figure 5:
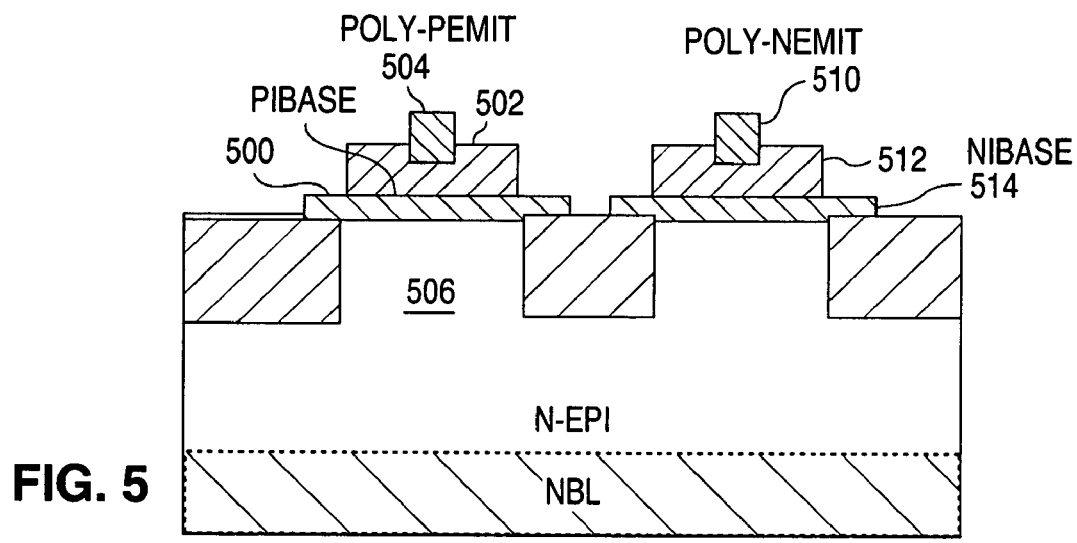
FIG. 5 shows a cross section through yet another embodiment of a SiGe architecture diode of the invention.

FIG. 5 shows an embodiment based on an NPN BJT process to form the first internal base 500, which is p-doped in accordance with the process. The external base regions are again blocked and the emitter poly 502 is doped with the same dopant type as the first base 500 (p-type) so that the emitter contact 504 defines the anode of the diode. The collector 506 is again formed by the n-epi region in accordance with the standard process steps. However, in this embodiment, instead of providing a sub-collector, the collector contact is defined by a second emitter contact 510 that contacts a second poly emitter 512, which is n-doped. To complete the connection to the collector 506, a second internal base 514 is formed beneath the emitter poly 512 and is also n-doped. As is the case with the first base, the external base regions of the second base are blocked to avoid extra parasitic capacitance. It will therefore be appreciated that the second emitter contact 510 defines the cathode of the diode in this embodiment.

Figure 6:
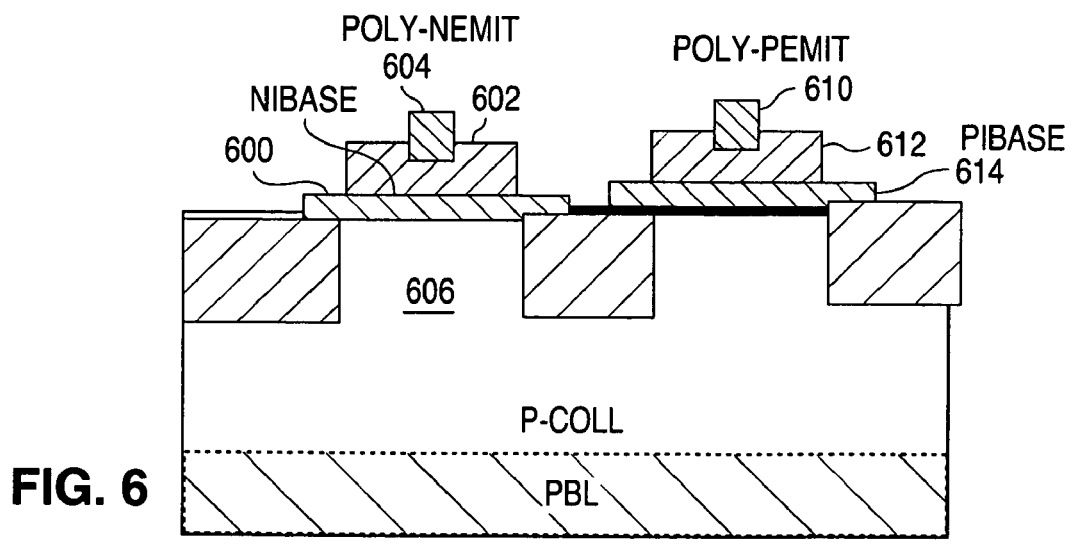
FIG. 6 shows a cross section through yet another embodiment of a SiGe architecture diode of the invention.

FIG. 6 shows an embodiment similar to that of FIG. 5 but making use of a PNP BJT architecture for the diode. In particular, a PNP BJT process is used to form the first internal base 600, which is n-doped in accordance with the process. The external base regions are again blocked and the emitter poly 602 is doped with the same dopant type as the first internal base 600 (n-type) so that the emitter contact 504 defines the cathode of the diode. The collector 606 is formed by the p-epi region in accordance with the standard process steps. However, in this embodiment, instead of providing a sub-collector, the collector contact is defined by a second emitter contact 610 that contacts a second poly emitter 612, which is p-doped. To complete the connection to the collector 606, a second internal base 614 is formed beneath the emitter poly 612 and is also p-doped. As is the case with the first base, the external base regions of the second base are blocked to avoid extra parasitic capacitance. It will therefore be appreciated that the second emitter contact 610 defines the anode of the diode in this embodiment.

While specific embodiments have been described in this application, these are by way of example only and are not intended to limit the invention which can be implemented in different ways without departing from the scope of the invention as defined by the claims. For instance, while the embodiments deal with SiGe devices, the invention is not so limited but covers any poly-emitter BJT.

What is claimed is:

1. A method of forming a Electrostatic Discharge (ESD) protection diode, comprising
   performing steps of a bipolar process used in forming a vertical bipolar junction transistor (BJT) that includes a collector, a base, and an emitter, said steps including forming a collector, forming an internal base on top of the collector, doping the internal base, and forming a polysilicon emitter region with emitter contact on top of the internal base region, the method further comprising
   establishing a contact to the collector, wherein the collector contact defines a contact to the ESD protection diode,
   blocking the formation of external base regions during the steps of the bipolar process, and
   doping the polysilicon emitter with the same dopant type as the internal base to establish the emitter contact as another contact to the ESD protection diode,
   wherein a p-n junction of the ESD protection diode is defined between the collector and the internal base of the BJT.

2. A method of claim 1, wherein the process is a SiGe process.

3. A method of claim 1, wherein establishing a contact to the collector includes forming a sub-collector comprising a sinker and a buried layer.

4. A method of claim 3, wherein the collector is p-type and forming the sub-collector includes forming a p-sinker and p-buried layer (PBL).

5. A method of claim 3, wherein the collector is n-type and forming the sub-collector includes forming an n-sinker and n-buried layer (NBL).

6. A method of claim 1, wherein establishing a contact to the collector includes forming a second polysilicon emitter region with a second emitter contact and a second internal base, the second polysilicon emitter region and second internal base being doped with the same dopant type as the collector, thereby defining the second emitter contact as collector contact.

7. A method of forming a diode using steps in the process of forming a vertical bipolar junction transistor (BJT) that includes a collector, a base, and an emitter, the BJT steps including
   forming an epitaxial region to define a collector,
   forming an internal base over the epitaxial region and doping the internal base, and
   forming a polysilicon emitter region with an emitter contact over the internal base, the method of forming a diode further comprising
   providing a collector contact that is electrically connected to the collector, doping the polysilicon emitter region with the same dopant type as the internal base, and defining the emitter contact as one contact to the diode and defining the collector contact as a second contact to the diode.

8. A method of claim 7, wherein the method further comprises blocking the formation of any external base regions.

9. A method of claim 7, wherein electrically connecting the collector contact to the collector includes forming a sinker and a buried layer of the same dopant type as the collector.

10. A method of claim 7, wherein electrically connecting the collector contact to the collector includes forming a second polysilicon emitter region with a second emitter contact and a second internal base, the second polysilicon emitter region and second internal base having the same dopant type as the collector such that the second emitter contact defines the collector contact.

* * * * *